United States Patent
Ha et al.

(10) Patent No.: US 9,698,117 B2
(45) Date of Patent: Jul. 4, 2017

(54) DIE BONDING APPARATUS

(71) Applicant: Samsung Electronics Co., Ltd., Suwon-Si, Gyeonggi-Do (KR)

(72) Inventors: Yongdae Ha, Asan-si (KR); Jaeryoung Lee, Asan-si (KR); Chulmin Kim, Cheonan-si (KR); Yisung Hwang, Asan-si (KR); Teaseog Um, Asan-si (KR); Yongjin Jung, Asan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 100 days.

(21) Appl. No.: 14/600,324

(22) Filed: Jan. 20, 2015

(65) Prior Publication Data

US 2015/0228612 A1 Aug. 13, 2015

(30) Foreign Application Priority Data

Feb. 10, 2014 (KR) .................. 10-2014-0015002

(51) Int. Cl.
*H01L 23/00* (2006.01)
*H01L 21/683* (2006.01)
*H01L 21/67* (2006.01)

(52) U.S. Cl.
CPC ........ *H01L 24/75* (2013.01); *H01L 21/67144* (2013.01); *H01L 21/6838* (2013.01); *H01L 2221/68363* (2013.01); *H01L 2224/7555* (2013.01); *H01L 2224/7565* (2013.01); *Y10T 156/1132* (2015.01); *Y10T 156/1179* (2015.01); *Y10T 156/1944* (2015.01); *Y10T 156/1983* (2015.01)

(58) Field of Classification Search
CPC ......... H01L 21/6838; H01L 2224/7565; Y10T 156/1132; Y10T 156/1944; Y10T 156/1179; Y10T 156/1983
See application file for complete search history.

(56) References Cited

U.S. PATENT DOCUMENTS

| | | | |
|---|---|---|---|
| 5,169,196 A | 12/1992 | Safabakhsh | |
| 6,171,049 B1 * | 1/2001 | Wirz | ................... H01L 21/6838 198/339.1 |
| 6,248,201 B1 * | 6/2001 | Boyd, IV | .......... H01L 21/67132 156/230 |
| 6,376,265 B1 | 4/2002 | Wong | |
| 6,648,215 B2 | 11/2003 | Leu | |

(Continued)

FOREIGN PATENT DOCUMENTS

| | | | | |
|---|---|---|---|---|
| JP | H11-260840 A | 9/1999 | | |
| JP | WO 2005013354 A1 * | 2/2005 | ....... | H01L 21/67144 |
| KR | 10-2001-0036400 A | 5/2001 | | |
| KR | 10-2005-011444 B1 | 1/2005 | | |
| KR | 10-2007-0016739 A | 2/2007 | | |

(Continued)

*Primary Examiner* — Mark A Osele
(74) *Attorney, Agent, or Firm* — Harness, Dickey & Pierce, P.L.C.

(57) ABSTRACT

The die bonding apparatus including a transferring unit, a loading member loading a substrate to the transferring unit, an unloading member unloading the substrate from the transferring unit, a wafer holder supporting a wafer providing dies, and a bonding member picking up one of the dies from the wafer and bonding the picked-up die to the substrate loaded on the transferring unit by pressuring the picked-up die against the substrate using a gas may be provided.

20 Claims, 13 Drawing Sheets

(56) References Cited

U.S. PATENT DOCUMENTS

| | | | |
|---|---|---|---|
| 7,047,632 B2* | 5/2006 | Arikado | H01L 21/67144 29/825 |
| 7,207,430 B2* | 4/2007 | Davis | H01L 21/6838 198/468.4 |
| 7,284,318 B2 | 10/2007 | Hartmann | |
| 7,445,688 B2* | 11/2008 | Suzuki | H01L 21/67132 156/716 |
| 7,498,241 B2* | 3/2009 | Maki | H01L 21/67132 257/E21.599 |
| 7,629,231 B2 | 12/2009 | Maki et al. | |
| 7,726,011 B2 | 6/2010 | Bosch et al. | |
| 8,450,150 B2 | 5/2013 | Maki et al. | |
| 8,465,619 B2* | 6/2013 | Okamoto | H01L 24/29 156/285 |
| 9,240,334 B2* | 1/2016 | Barmettler | H01L 21/67132 |
| 2002/0030089 A1 | 3/2002 | Leu | |
| 2003/0101576 A1 | 6/2003 | Hartmann | |
| 2003/0145939 A1* | 8/2003 | Ahn | H01L 21/67132 156/235 |
| 2006/0057780 A1 | 3/2006 | Tajimi et al. | |
| 2006/0266792 A1* | 11/2006 | Ko | B23K 37/047 228/6.2 |
| 2007/0137031 A1 | 6/2007 | Bosch et al. | |
| 2007/0275544 A1 | 11/2007 | Maki et al. | |
| 2010/0261312 A1 | 10/2010 | Maki et al. | |

FOREIGN PATENT DOCUMENTS

| | | |
|---|---|---|
| KR | 10-2008-0088103 A | 10/2008 |
| KR | 10-2009-0005551 A | 1/2009 |
| KR | 10-0876965 B1 | 1/2009 |

* cited by examiner

DIE BONDING APPARATUS

CROSS-REFERENCE TO RELATED APPLICATIONS

This U.S. non-provisional patent application claims priority under 35 U.S.C. §119 of Korean Patent Application No. 10-2014-0015002, filed on Feb. 10, 2014, the entire contents of which are hereby incorporated by reference.

BACKGROUND

Some example embodiments provide die bonding apparatuses.

Semiconductor packaging processes include a sawing process for cutting a wafer to separate the wafer into individual dies (e.g., individual semiconductor chips), a die bonding process for bonding the individual dies to a substrate, a wire bonding process for electrically connecting the dies to connection pads of the substrate, a molding process for molding the dies and the peripheries of the dies, and a process for forming an external connection terminal on a ball pad of the substrate.

The die bonding process for bonding a die to a substrate is performed by using a die bonding apparatus. The die bonding apparatus pressurizes the dies onto the substrate to bond the dies to the substrate. Here, when an imbalance of a force occurs according to areas of the die while the die bonding apparatus pressurizes the dies, the dies may be damaged.

SUMMARY

At least one example embodiment provides a die bonding apparatus for mitigating or preventing a die from being damaged while the die is bonded to a substrate.

According to an example embodiment, a die bonding apparatuses includes a transferring unit, a loading member configured to load a substrate to the transferring unit, an unloading member configured to unload the substrate from the transferring unit, a wafer holder configured to support a wafer providing dies, and a bonding member configured to pick up one of the dies from the wafer and configured to bond the picked-up die to the substrate loaded on the transferring unit by pressuring the picked-up die against the loaded substrate using a gas, thereby bonding the die to a top surface of the substrate located on the transferring unit.

In some example embodiments, the bonding member may include a body, a bonding head coupled to and disposed under the body, the bonding head having an adsorption hole configured to pick the die using a suction pressure and outer pressurizing grooves outside the adsorption hole and outer pressurizing grooves outside the adsorption hole, the outer the outer pressurizing grooves providing a space, in which the gas pressurizing the picked-up die is received, and a pressurizing tube connected to a gas supply member and configured to supply the gas to the outer pressurizing grooves.

In some example embodiments, the pressurizing tube may include a main pressurizing tube connected to the gas supply member, and branch tubes branching from the main pressurizing tube, the branch tubes being connected to the outer pressurizing grooves, respectively.

In some example embodiments, a distribution space defined between the main pressurizing tube and branch tubes and configured to distribute the gas supplied from the mail pressurizing tube to the branch tubes may be defined in at least one of the body and the bonding head.

In some example embodiments, the distribution space may include a main distribution space connected to the main pressurizing tube, the mail distribution space having a ring shape, and branch spaces defined in the bonding head and connected to the main distribution space, the branch spaces extending toward an outside of the bonding head in a lower portion of the main distribution space.

In some example embodiments, the branch spaces may include first branch spaces at both sides of the main distribution space, each of the first branch spaces having a rod shape, and second branch spaces at both sides of the main distribution space, each of the second branch spaces inclined with respect to a length direction of the first branch space.

In some example embodiments, the die bonding apparatus may further include an inner pressurizing groove between the adsorption hole and the outer pressurizing grooves at a bottom surface of the bonding head, the inner pressurizing groove having a uniform width in each direction with respect to a center the adsorption hole. The inner pressurizing groove may provide a space in which the gas is received.

In some example embodiments, the die bonding apparatus may further include an adsorption part protruding from a center of a bottom surface of the bonding head.

In some example embodiments, the transferring unit may include rails disposed between loading member and the unloading member, and a shuttle configured to travel along the rails and support the substrate, wherein the die bonding apparatus may further include an auxiliary bonding member disposed on a path through which the shuttle travels and the auxiliary bonding member is configured to pressurize the die bonded to the substrate located on the shuttle.

In some example embodiments, the auxiliary bonding member may be configured to further pressurize the bonded die against the loaded substrate using a gas.

According to an example embodiment, A die bonding apparatus includes a body, a bonding head connected to the body and configured to pressurized a die against a substrate such that the die is bonded to the substrate, the bonding head including, a first pressurizing portion configured to pressurize a first portion of the die against the substrate mechanically, and a second pressurizing portion configured to pressurize a second portion of the die against the substrate by gas pressure.

In some example embodiments, the first portion may be a central portion of the die, and the second portion is outside the central portion.

In some example embodiments, the first pressurizing portion may be a protrusion at a bottom surface of the bonding head.

In some example embodiments, the second pressurizing portion may be at least one pressurizing groove surrounding the protrusion.

In some example embodiments, when pressurizing the die, a lowermost point of the first pressurizing portion may be configured to be in a closer proximity to the die than a lowermost point of the second pressurizing portion.

In some example embodiments, the first pressurizing portion may downwardly protrude further than the second pressurizing portion.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings.

DETAILED DESCRIPTION

Figure 1:
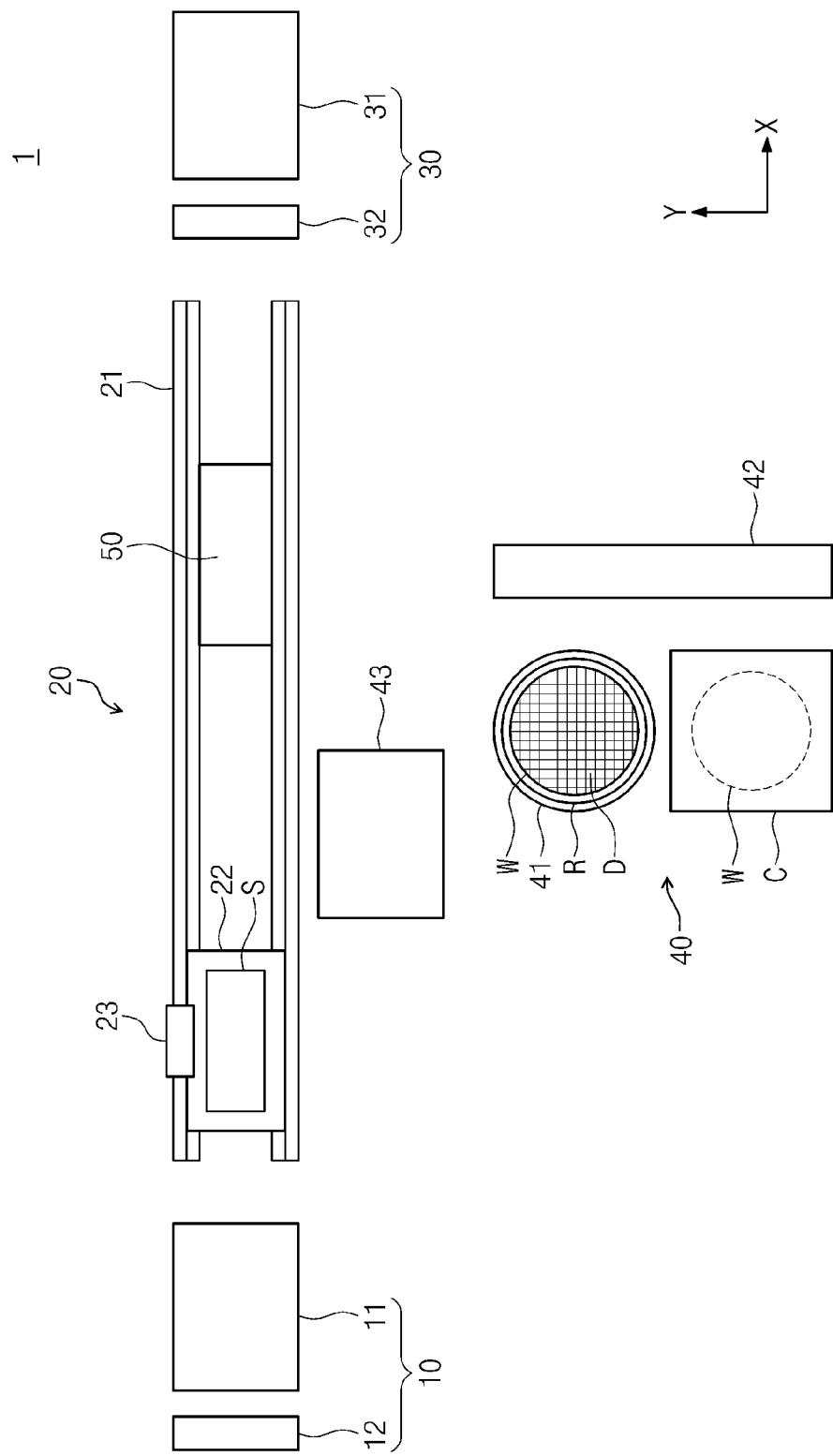
FIG. 1 is a plan view of a die bonding apparatus according to an example embodiment of the inventive concepts.

Example embodiments of the inventive concepts will be described below in more detail with reference to the accompanying drawings. The inventive concepts may, however, be embodied in different forms and should not be constructed as limited to the example embodiments set forth herein. Rather, these example embodiments are provided so that this disclosure will be thorough and complete, and will fully convey the scope of the inventive concepts to those skilled in the art. In the drawings, the thicknesses of layers and regions are exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, some example embodiments will be explained in further detail with reference to the accompanying drawings.

FIG. 1 is a plan view of a die bonding apparatus according to an example embodiment of the inventive concepts.

Referring to the FIG. 1, a die bonding apparatus 1 includes a loading member 10, a transferring unit 20, an unloading member 30, a die supply unit 40, and a supporting bonding member 50.

Hereinafter, a direction where the loading member 10 and the unloading member 30 are spaced apart from each other will be referred to as a first direction X, a direction perpendicular to the first direction X will be referred to as a second direction Y when viewed from the top, and a vertical direction perpendicular to the first and second directions X and Y will be referred to as a third direction Z.

The loading member 10 loads a substrate S on the transferring unit 20. The loading member 10 includes a supply container 11 and a loader 12. The substrate S where semiconductor chips (hereinafter, referred to as "dies") are to be bonded may be accommodated in the supply container 11. The loader 12 may successively load the substrate S, to be accommodated in the supply container 11, to the transferring unit 20. The substrate S may be, for example, a printed circuit boards (PCB) or a lead frame.

The transferring unit 20 has a space in which the substrate S loaded from the loading member 10 is located and then the die D is bonded to the substrate S. The transferring unit 20 is disposed adjacent to the loading member 10. The transferring unit 20 may include, for example, rails 21 and a shuttle 22.

The rails 21 may be disposed between the loading member 10 and the unloading member 30. For example, the rails 21 may be longitudinally disposed in the first direction X. The rails 21 may be spaced apart from and in parallel to each other in the second direction Y.

The shuttle 22 may be disposed on the rails 21. The shuttle 22 may have a flat top surface. The top surface of the shuttle 22 may have an area greater than that of the substrate S. The shuttle 22 may be movable along the rails 21 between the loading member 10 and the unloading member 30. For example, the shuttle 22 may move on the rails 21 by a power provided from the outside. For example, a gripper 23 may be disposed on at least one of the rails 21. The gripper 23 may be movable along the rails 21. One side of the gripper 23 may be connected to the shuttle 22. The shuttle provides the space in which the substrate S, to which the die D is to be bonded, is located. An auxiliary bonding member 50, which will be described later, may be provided on a moving path of the shuttle 22.

The unloading member 30 unloads the substrate S, to which the die D is bonded, from the transferring unit 20. The unloading member 30 is disposed adjacent to the transferring unit 20. For example, the unloading member 30 may be disposed on an opposite side of the loading member 10 with respect to the transferring unit 20. The unloading member 30 includes a receiving container 31 and an unloader 32. The substrate S to which the die D is bonded may be accommodated in the receiving container 31. The unloader 32 may unload the substrate S, to which the die D is bonded, from the shuttle 22 to the receiving container 31.

A die supply unit 40 separates the die D from a wafer W to bond the die D on the substrate S disposed on the transferring unit 20. The die supply unit 40 may be disposed adjacent to the transferring unit 20. For example, the die supply unit 40 may be spaced apart from the rails 21 in the second direction Y. The die supply unit 40 may include, for example, a wafer holder 41, a transferring robot 42, and a bonding member 43.

The wafer holder 41 supports the wafer W while the die D is separated from the wafer W. The wafer W may be transferred to a position adjacent to the die supply unit 40 in a state where the wafer W is accommodated in a cassette C. The cassette C may be disposed adjacent to the wafer holder 41. For example, the cassette C may be disposed on a side opposite to the transferring unit 20 with respect to the wafer holder 41. The cassette C may move by a worker or a transfer device. For example, a carrying device for moving the cassette C may include, for example, an overhead hoist transport (OHT) or an automatic guided vehicle. The wafer W may include a wafer W in which a fabrication process (e.g., an electrical die sorting process (EDS) or a back grinding process) is performed. A film may be attached to a bottom surface of the wafer W. Then, a sawing process may be performed on the wafer W such that the sawed dies D are attached on a top surface of the film. The top surface of the film may be UV-treated to easily separate the dies D therefrom. Further, a wafer ring R may be provided on an edge of the wafer W. The wafer holder 41 may support the wafer ring R while the wafer holder 41 pulls the wafer ring R outward to expand the film, thereby easily separating the dies D from the film.

The transferring robot 42 may be disposed adjacent to the wafer holder 41 and the cassette C. The transferring robot 42 may withdraw the wafer W from the cassette C to place the wafer W on the wafer holder 41.

A die ejector may be provided inside the wafer holder 41 to be disposed below the wafer W. The die ejector may separate each of the dies D from the film.

Figure 2:
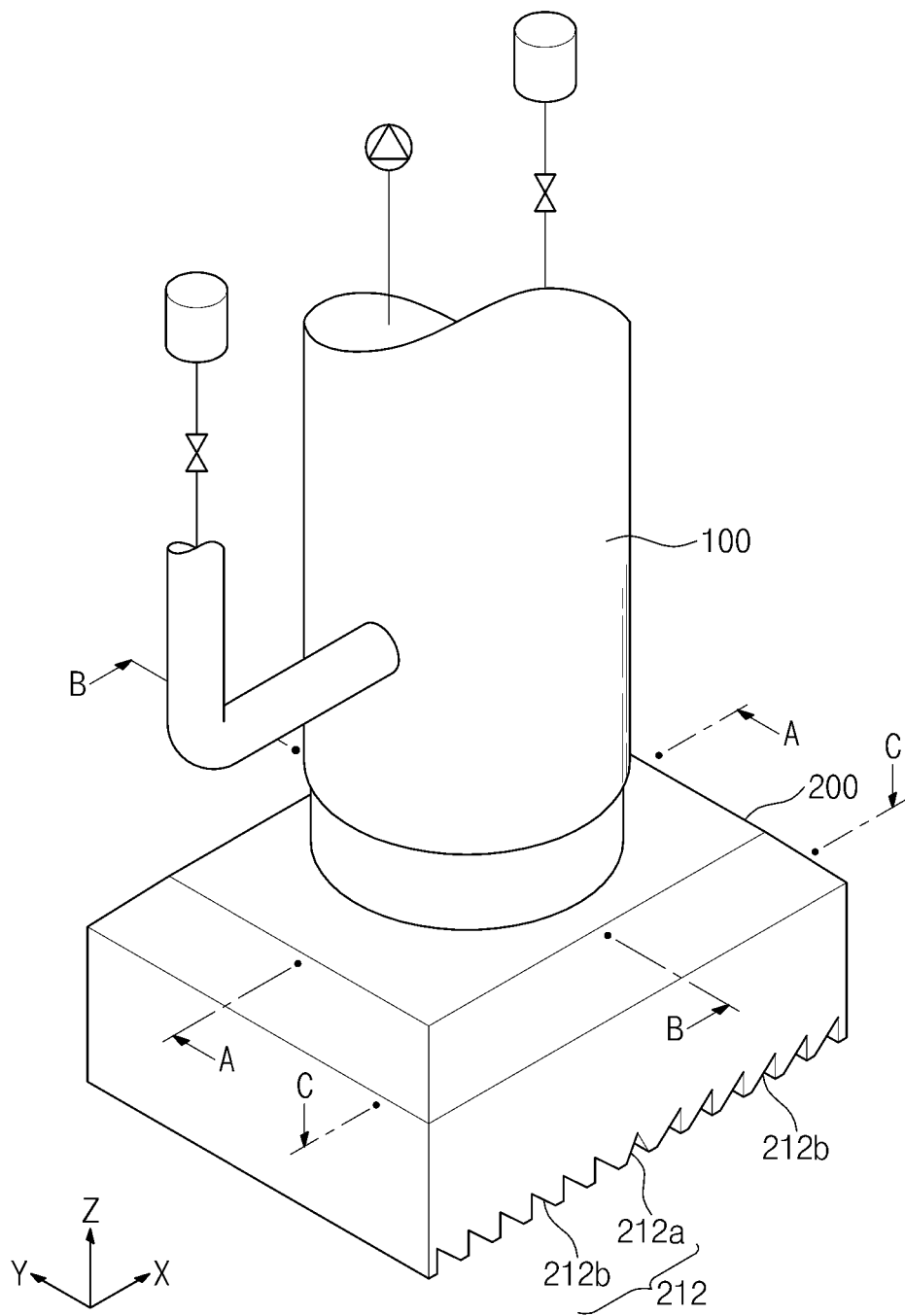
FIG. 2 is a perspective view illustrating a bonding member of FIG. 1.

FIG. 2 is a perspective view illustrating a bonding member of FIG. 1.

Referring to the FIG. 2, the bonding member 43 includes a body 100 and a bonding head 200.

The bonding member 43 may be movable between the wafer holder 41 and the transferring unit 20 and configured to, after picking up the die D from the wafer W, bond the dies D to the substrate S disposed on the transferring unit 20.

The body 100 may be movable in the first direction X and the second direction Y. For example, an upper portion of body 100 may be connected to, for example, a rail structure, a gantry structure, a chain structure, or a belt structure and may be movable in the first and second directions X and Y. Further, a lower portion of the body 100 may be movable in the third direction Z. Thus, because the structure to which the upper portion of the body 100 is connected can be configured to be vertically elevated, the body 100 may also be movable in the third direction Z. Because the body 100 may have a cylinder structure or a telescopic structure, a height of the lower portion of body 100 may be adjusted.

Figure 3:
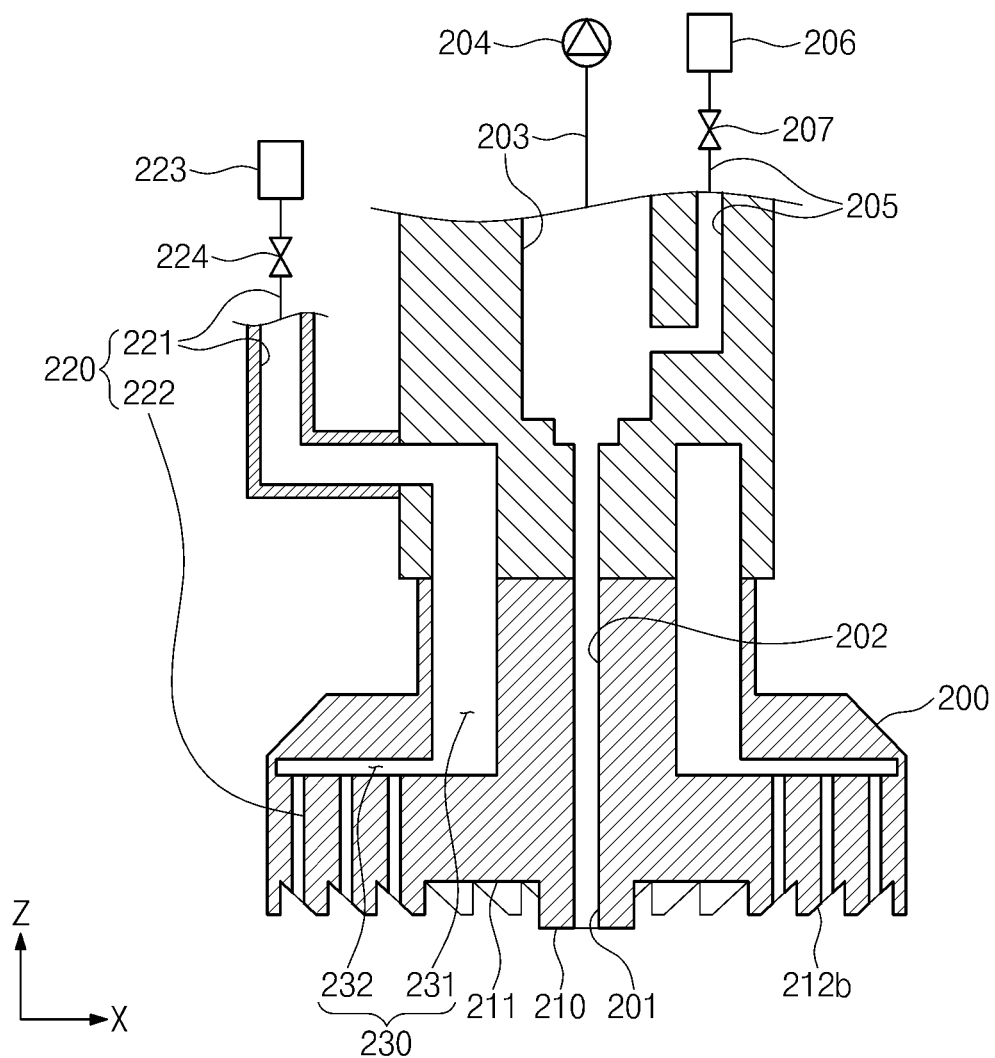
FIG. 3 is a cross-sectional view taken along line A-A of FIG. 2.

FIG. 3 is a cross-sectional view taken along line A-A of FIG. 2.

Referring to the FIGS. 2 and 3, the bonding head 200 is disposed under the body 100. The bonding head 200 may pick up the die D disposed on the wafer W in a vacuum adsorption manner. For example, an adsorption hole 201 may be defined in a bottom surface of the bonding head 200. The adsorption hole 201 may be defined at a center of the bottom surface of the bonding head 200. The adsorption hole 201 is connected to an adsorption tube 202. The adsorption tube 202 may be disposed upward to cross the inside of the bonding head 200 in a lower portion of the bonding head 200. The adsorption tube 202 may extend up to a lower portion of the body 100.

The adsorption tube 202 maybe connected to an intake tube 203 and a purge tube 205.

The intake tube 203 connects an intake member 204 to the adsorption tube 202. The intake member 204 exhausts a gas in the adsorption tube 202 to form an adsorption pressure in the adsorption hole 201. For example, the intake member 204 may be provided as a pump for exhausting the gas in the adsorption tube 202.

The purge tube 205 connects a purge gas supply member 206 to the adsorption tube 202. The purge gas supply member 206 supplies a purge gas to the adsorption tube 202. When the purge gas is supplied to the adsorption tube 202, the adsorption pressure formed in the adsorption hole 201 may be reduced or removed. The purge tube 205 may include a purge valve 207 that is capable of opening and closing the purge tube 205 or adjusting an opened degree of the purge tube 205.

Figure 4:
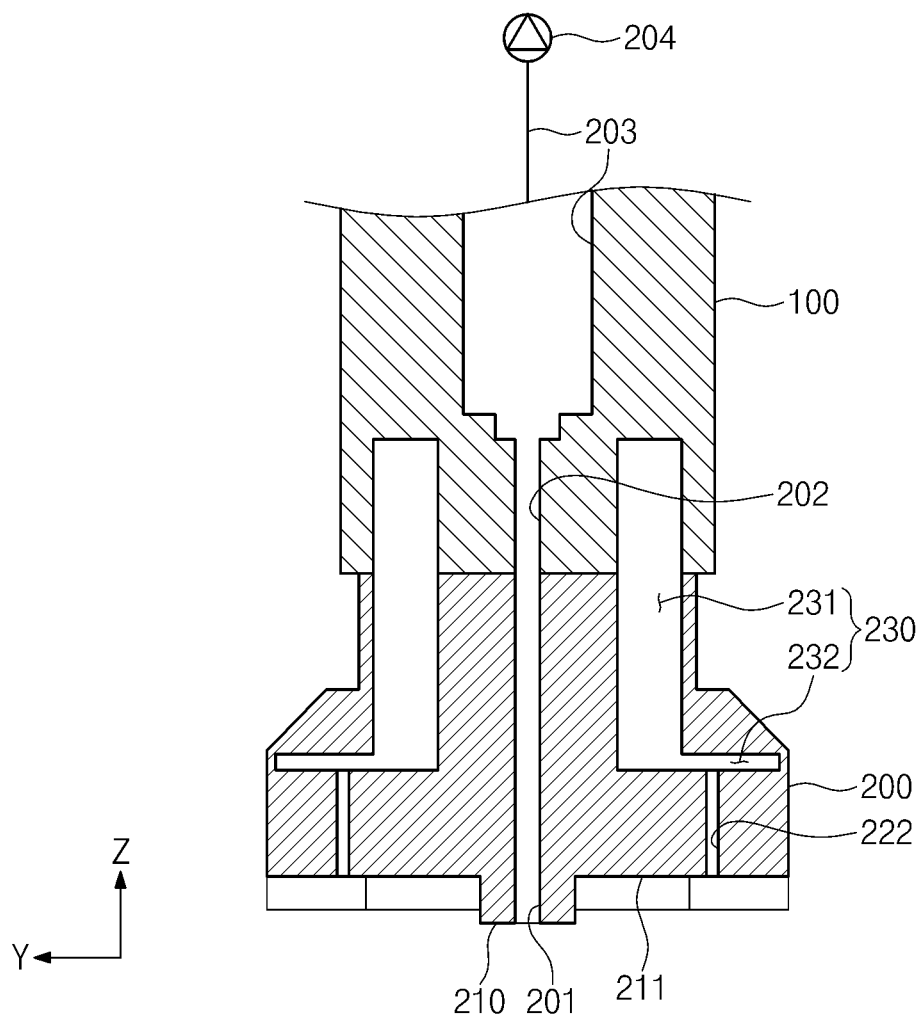
FIG. 4 is a cross-sectional view taken along line B-B of FIG. 2.
Figure 5:
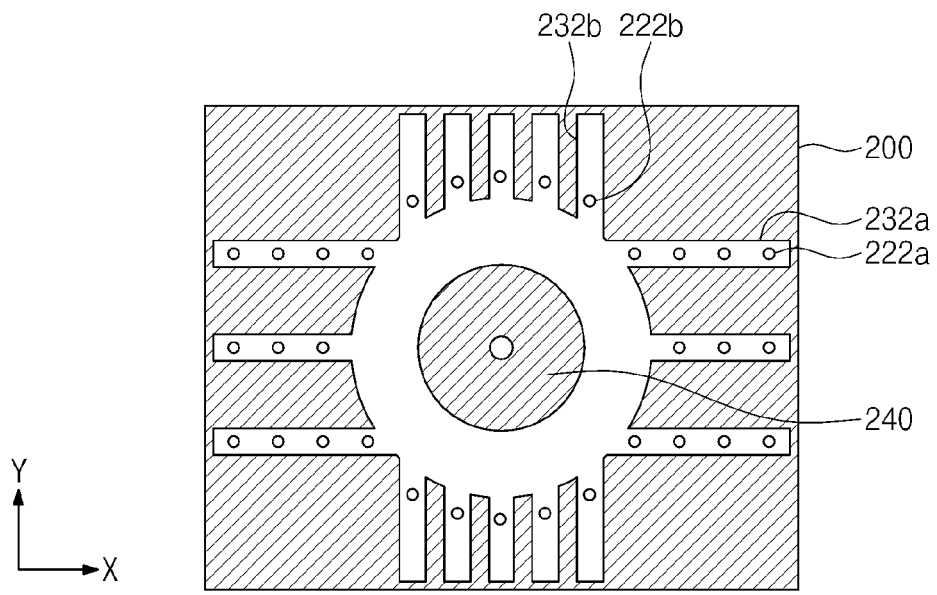
FIG. 5 is a cross-sectional view taken along line C-C of FIG. 2.
Figure 6:
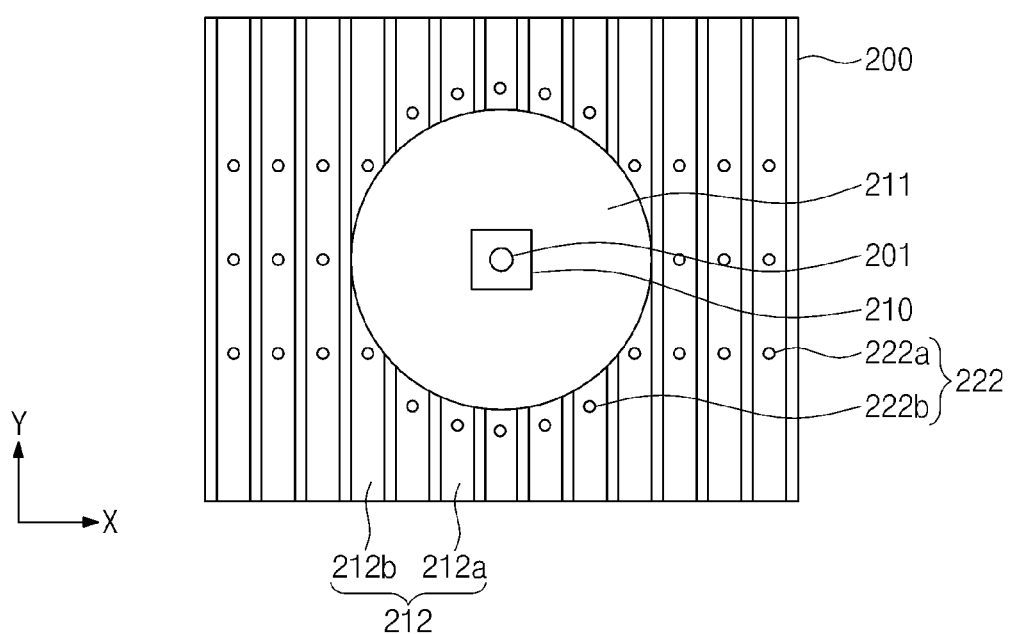
FIG. 6 is a bottom view of a bonding head illustrated in FIG. 2.

FIG. 4 is a cross-sectional view taken along line B-B of FIG. 2, FIG. 5 is a cross-sectional view taken along line C-C of FIG. 2, and FIG. 6 is a bottom view of a bonding head illustrated in FIG. 2.

Referring to FIGS. 2 to 6, an adsorption part 210, an inner pressurizing groove 211, and outer pressurizing grooves 212 may be disposed on/in the bottom surface of the bonding head 200.

The adsorption part 210 surrounds the adsorption hole 201. Thus, in a case where the adsorption hole 201 is defined at the center of the bottom surface of the bonding head 200, the adsorption part 210 is disposed at the center of the bottom surface of the bonding head 200. The adsorption part 210 protrudes toward the lowest surface of the bottom surface of the bonding head 200. The adsorption part 210 may have a flat bottom surface. The adsorption part 210 may have a round, an oval, or a polygonal shape when viewed from a lower side.

The inner pressurizing groove 211 may be disposed at a circumference of the adsorption part 210. The inner pressurizing groove 211 may be provided as a groove defined in the bottom surface of the bonding head 200. The inner pressurizing groove 211 may have a desired (or alternatively, predetermined) width outward from an outer surface of the adsorption part 210. The inner pressurizing groove 211 may have a round, an oval, or a polygonal shape when viewed from a lower side.

The inner pressurizing groove 211 provides a space in which the gas for pressurizing the die D is received. The inner pressurizing groove 211 may have a uniform width in each direction with respect to the center of the adsorption hole 201. For example, when viewed from the lower side of the bonding head 200, an outer edge of the inner pressurizing groove 211 may have a circular shape surrounding the adsorption hole 201.

The outer pressurizing grooves 212 provide spaces in which the gas for pressurizing the die D is received, and includes a central pressurizing groove 212a and non-central pressurizing grooves 212b. The outer pressure grooves 212 may be defined at an outer portion of the bonding head 200 over a bottom surface of the bonding head 200. For example, when viewed at the bottom surface of the bonding head 200, each of the outer pressurizing grooves 212 may have a linear shape. The outer pressurizing grooves 212 may run in parallel and may be spaced by a desired (or alternatively, predetermined) distance from each other. A portion of the outer pressurizing grooves 212 may be connected to an outer portion of the inner pressurizing groove 211. Side surfaces of the outer pressurizing grooves 212 may have symmetrical shapes with respect to the center axis of the bottom surface of the bonding head 200. For example, the central pressurizing groove 212a disposed on a line passing through the center axis of the bottom surface of the bonding head 200 may have a side surface having a regular triangular shape or an isosceles triangular shape. Side surfaces of the non-central pressurizing groves 212b disposed on both sides of the central pressurizing grooves 212a may have symmetrical shapes with respect to the central pressurizing groove 212a. Each of the non-central pressurizing grooves 212b has an inclination in a direction towards the center axis of the bottom surface of the bonding head 200. Here, the inclinations of the non-central pressurizing grooves 212b may be less than that in a direction toward the outside of the bottom surface of the bonding head 200. For example, the non-central pressurizing grooves 212b may have side surfaces having a right-angled triangle shape in which one side is vertical and another side is inclined in a direction towards the center axis of the bottom surface of the bonding head 200. Further, the lowermost point of the adsorption part 210 may downwardly protrude from the bottom surface of the bonding head 200 further than the lowermost point of the surrounding pressurizing grooves 211 and 212.

Each of the outer pressurizing grooves 212 is connected to a gas supply member 223 through a pressurizing tube 220. The gas supply member 223 stores and supplies the gas supplied into each of the outer pressurizing grooves 212 to pressurize the die D. The pressurizing tube 220 includes a main pressurizing tube 221 and branch tubes 220.

The main pressurizing tube 221 has one end connected to the gas supply member 223 and the other end connected to the body 100 or the bonding head 200. A valve 224 for opening and closing the main pressurizing tube 221 or adjusting an opened degree of the main pressurizing tube 221 may be provided.

A distribution space 230 may be defined between the main pressurizing tube 221 and the branch tubes 222. The distribution space 230 distributes the gas supplied through the main pressurizing tube 221 into each of the branch tubes 222. The distribution space 230 may be defined over the inside of the body 100 or inside of the bonding head 200. For example, when the main pressurizing tube 221 is connected to the body 100, the distribution space 230 may be defined both inside the body 100 and inside the bonding head 200. Further, when main pressurizing tube 221 is connected to the bonding head 200, the distribution space 230 may be defined in the bonding head 200. The distribution space 230 may include a main distribution space 231 and branch spaces 232.

The main pressurizing tube 221 is connected to an upper portion of the main distribution space 231. The main distribution space 231 may be defined in the bonding head 200 or both inside of the bonding head 200 and the inside of the body 100. The main distribution space 231 may be spaced apart from the adsorption tube 202 by a partition unit 240. The main distribution space 231 has a desired (or alternatively, predetermined) height and width to have a desired (or alternatively, predetermined) volume. The main distribution space 231 may have a ring-shaped transversal section. Thus, the gas introduced through main distribution tube 221 may be distributed in a ring shape while the gas moves downward from the upper portion of the main distribution space 231.

The branch spaces 232 are connected to a lower portion of the main distribution space 231. Each of the branch spaces 232 is defined from the circumference of the main distribution space 231 toward the outer portion of the boding head 200. The branch spaces 232 include first branch spaces 232a and second branch spaces 232b.

Each of the first branch spaces 232a may have a rod shape. The first branch spaces 232a may be defined at both sides of the main distribution space 231. The first branch spaces 232a defined in both sides of the main distribution space 231 may be symmetrical to each other with respect to the main distribution space 231. A length direction of the first branch spaces 232a may be inclined with respect to that of the outer pressurizing grooves 212 when viewed from the top or the bottom. For example, the length direction of the first branch spaces 232a may be vertical to the length direction of the outer pressurizing grooves 212. The first branch spaces 232a may be spaced apart from each other in a direction that is vertical to the length direction of the first branch spaces 232a. Each of the first branch spaces 232a is connected to each of the outer pressurizing grooves 212 by the branch tubes 222. In detail, the first branch spaces 232a are connected to a portion of the non-central pressurizing grooves 212b by first branch tubes 222a. Each of the first branch spaces 232a is connected to the plurality of non-central pressurizing grooves 212b by the plurality of first branch tubes 222a defined along a length direction of the first branch space 232a. Because each of the non-central pressurizing grooves 212b receives the gas from the plurality of first branch tubes 222a, the non-central pressurizing grooves 212b may provide the gas in more uniform manner.

Each of the second branch spaces 232b also may have a rod shape. The second branch spaces 232b may be defined at both sides of the main distribution space 231. The second branch spaces 232b defined at both sides of the main distribution space 231 may be symmetrical to each other with respect to the main distribution space 231. A length direction of the second branch space 232b may be inclined with respect the length direction of the first branch space 232a when viewed from the top or the bottom. For example, the length direction of the second branch space 232b may be in parallel with that of the outer pressurizing grooves 212. The second branch space 232b may have the same number as that of the outer pressurizing grooves 212 that are not connected to the first branch space 232a (instead, connected to due to the first branch tubes 222a). Each of the second branch spaces 232b may be connected to each of the outer pressurizing grooves 212 one by one. Each of the outer pressurizing grooves 212 receives the gas from the plurality of second branch spaces 232b defined at both sides of the main distribution space 231. Thus, uniformity of the gas distribution provided through the outer pressurizing grooves 212 may be improved.

Figure 7:
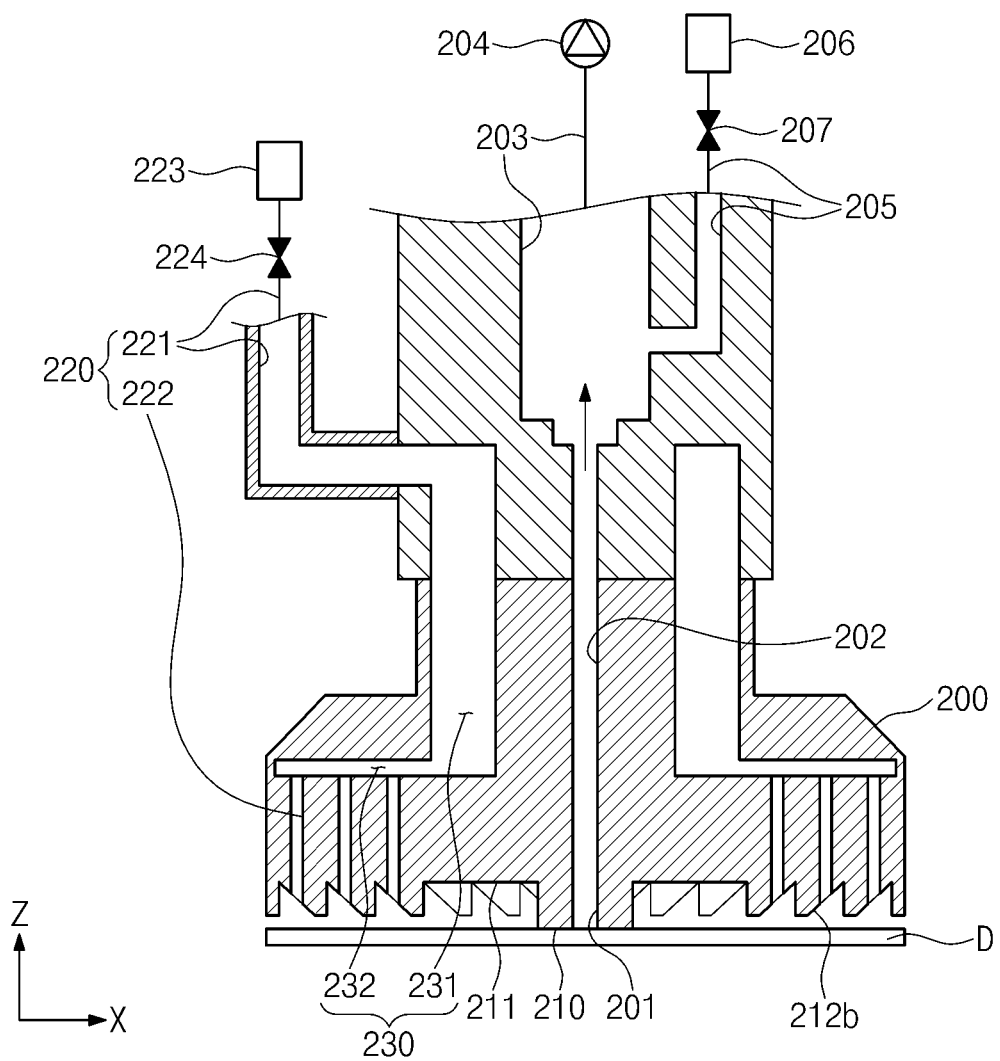
FIG. 7 is a cross-sectional view of the bonding member in a state where a die is adsorbed to the bonding member.

FIG. 7 is a cross-sectional view of the bonding member in a state where a die is adsorbed to the bonding member.

Referring to FIGS. 1 to 7, a process in which a die D is vacuum-adsorbed onto a bonding member 43 will be described.

A bonding head 200 may move above a wafer W located in a wafer holder 41. The bonding head 200 is aligned with respect to the wafer W so that an adsorption part 210 is disposed above the die D to be separated from the wafer W. Here, the bonding head 200 may be aligned so that the adsorption part 210 disposed on a bottom surface thereof is located above the central portion of the die D. Then, the bonding head 200 may descend toward the die D so that the adsorption part 210 contacts the die D. When the adsorption part 210 contacts the die D, the intake member 204 operates to exhaust a gas in the adsorption tube 202, thereby generating a suction pressure in the adsorption hole 201. The purge valve 207 may close a purge tube 205 while the intake member 204 is in operation. Further, the valve 224 may be maintained in a closed state while the bonding head 200 vacuum-adsorbs the die D. When the die E is attached to the bonding head 200 by using the suction pressure formed in the adsorption hole 201, the bonding head 200 may move in a third direction Z and move toward a substrate located on the shuttle 22.

Figure 8:
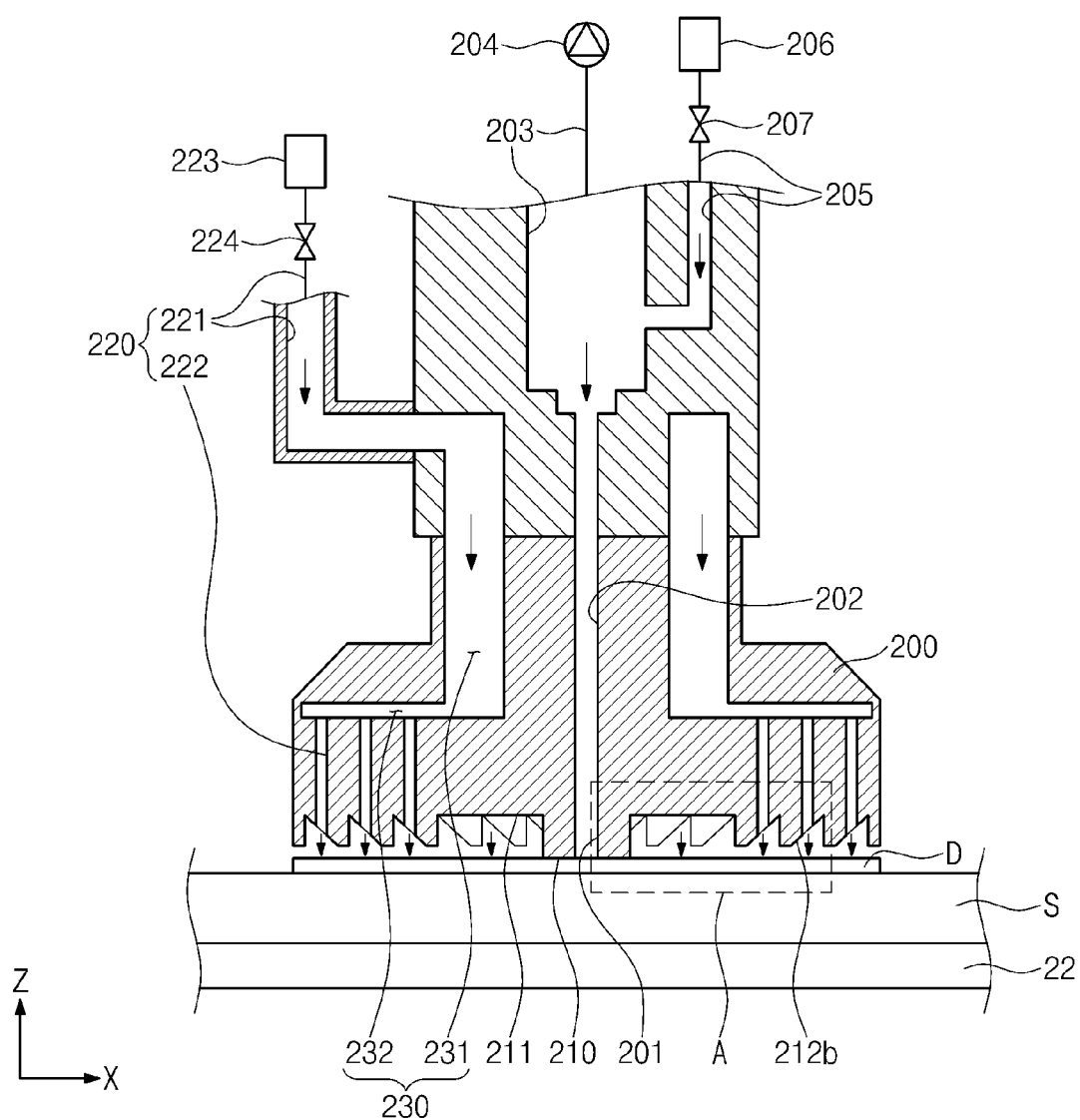
FIG. 8 is a cross-sectional view of the bonding member in a state where the die is bonded to a substrate.

FIG. 8 is a cross-sectional view of the bonding member in a state where the die is bonded to a substrate.

Referring to FIGS. 1 to 8, a process in which the die D is bonded to the substrate S will be described.

The position of the bonding head 200 may be adjusted in any one of first to third directions X to Z so that the die D is located at the center of a top surface of the substrate S. When the die D is completely aligned on the top surface of the substrate S, the die D may be bonded to the top surface of the substrate S through a separation process and first and second pressurizing processes.

A process of separating the die D from the bonding head 200 will be described as follows. The intake member 204 may stop its operation when the die D is aligned with the substrate S. Then, the purge valve may be opened to supply a purge gas into the adsorption tube 202, and the suction pressure formed in the adsorption hole 201 may be removed. As a result, the die D may be separated from the adsorption part 210. Stopping the operation of the intake member 204 and opening of the purge valve 207 may be performed at the same time. The purge valve 207 may be opened prior to the intake member 204 stopping operation. Further, the intake member 204 may stop operation after the purge valve 207 is opened.

Subsequently, the die D may be bonded to the substrate S through the first and second pressurizing processes. The die D may be bonded to the substrate S by an adhesive. A conductive adhesive (e.g., a silver-epoxy (Ag-epoxy) or a silver-glass (Ag-glass)) may be used as the adhesive for bonding the die D to the substrate S. The adhesive may be applied onto the top surface of the substrate S before the bonding head 200 bonds the die D to the substrate S. For example, the adhesive may be applied onto the top surface of the substrate S moving from the loading member 10 to the shuttle 22. The shuttle 22 may transfer the substrate S to a position adjacent to the bonding member 43. Further, an adhesive may be provided on the bottom surface of the die D bonded to the substrate S. For example, the adhesive may be provided between the bottom surface of the die D and a top surface of a film and the adhesive is separated together with the die D when separating the die D from the film.

The first pressurizing process may be mechanically performed by the adsorption part 210. For example, because the die D is located on the top surface of the substrate S, the bonding head 200 may pressurize the die D against the substrate S at a desired (or alternatively, preset) pressure.

Therefore, the die D may be bonded to the substrate S by a force applied by the adsorption part 210 toward the substrate S.

The first pressurizing process may start before the separation process of the die D starts or together with the separation process of the die D. The first pressurizing process may starts while the die D is separated. The first pressurizing process may be finished before the separation process of the die D is finished or together with a completion of the separation process of the die D. Further, the first pressurizing process may be finished after the die D is separated.

Further, the first pressurizing process may start and be finished after the die D is separated.

According to an example embodiment, damage of the die D may be mitigated or prevented in the first pressurizing process. When the die D is bonded to the substrate S by the mechanical force from the bonding head 200, the force applied to the die D may be different according to areas of the die D. When the bonding head 200 moves to pressurize the die D in the third direction Z, the bottom surface of the bonding head 200 may have different movement distances according to positions of the bottom surface of the bonding head 200, resulting in imbalance of the force applied to the die D. A shaft of the body 100 may be distorted while a lower portion of the body 100 connected to the bonding head 200 is mechanically adjusted in height. Thus, the force applied to the die D by the bottom surface of the bonding head 200 may be different with respect to areas of the die D. As a result, the die D may be damaged while the bonding head 200 mechanically pressurizes the die D. The imbalance of the force may occur due to particles. The particles may be disposed between the die D and a contact surface of the bonding head 200 while the bonding head 200 picks up the die D. The particles may be attached to the bottom surface of the die D or the top surface of the substrate S and thus may reside between the die D and the substrate S. The particles may damage the die D due to the imbalance of the force according to areas of the die D when the die D is pressurized. According to some example embodiments, the die D may be pressurized by the adsorption part 210 provided in a portion of the bottom surface of the bonding head 200. Therefore, an area of the die D to be mechanically pressurized may be reduced, and thus damage on the die D, which is caused by the imbalance of the force applied to different areas of the die D when the die D is mechanically pressurized, may be reduced or prevented.

Figure 9:
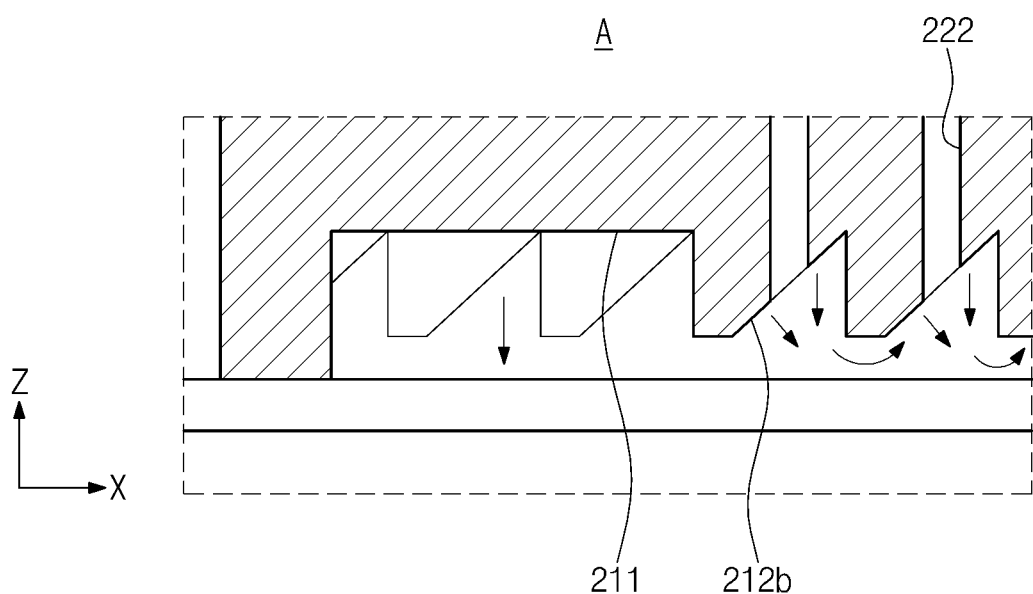
FIG. 9 is a view illustrating an area A of FIG. 8.

FIG. 9 is a view illustrating an area A of FIG. 8.

Referring to FIGS. 1 to 9, the second pressurizing process will be described.

The second pressurizing process may be performed by gas supplied from the gas supply member 223. For example, when the valve 224 is opened, the gas flows into the main distribution space 231 through the main pressurizing tube 221. Then, the gas is branched into the branch tubes 222 in the branch space 232. The branched gases are supplied to the outer pressurizing grooves 212. Further, the gases are supplied to the pressurizing part 211 through some of the outer pressurizing grooves 212, which are connected to the pressurizing part 211 among the outer pressurizing grooves 212.

A pressure formed between the bottom surface of the bonding head 200 and the die D due to the supply of the gas may pressurize the top surface of the die D toward the substrate S. Because the outer pressurizing grooves 212 may have side surfaces which are symmetrical to each other with respect to the center axis of the bottom surface of the bonding head 200, the force applied to the die D by the gas also may be symmetrical with respect to the center axis of the bottom surface of the bonding head 200. Each of non-central pressurizing grooves 212b, which is inclined toward the center axis of the bottom surface of the bonding head 200, may have an inclination less than that in a direction toward the outside of the bottom surface of the bonding head 200. Thus, the gas may flow toward the outside of the bonding head 200. Therefore, this may mitigate or prevent an eddy from being generated between the bonding head 200 and the die B or mitigate or prevent the gas from being non-uniformly distributed between the bonding head 200 and the die D.

The second pressurizing process may start together with the first pressurizing process for the die D or start while the first pressurizing process is performed. The second pressurizing process may be finished before the first pressurizing process is finished or together with the first pressurizing process. Further, the second pressurizing process may be finished after the first pressurizing process is finished.

Further, the second pressurizing process may start and be finished after the first pressurizing process is finished.

According to an example embodiment, because the die D is pressurized against the substrate S using a gas-based pressure and thus bonded to the substrate S, damage to the die inflicted while bonding the die D to the substrate S may be mitigated or prevented.

Figure 10:
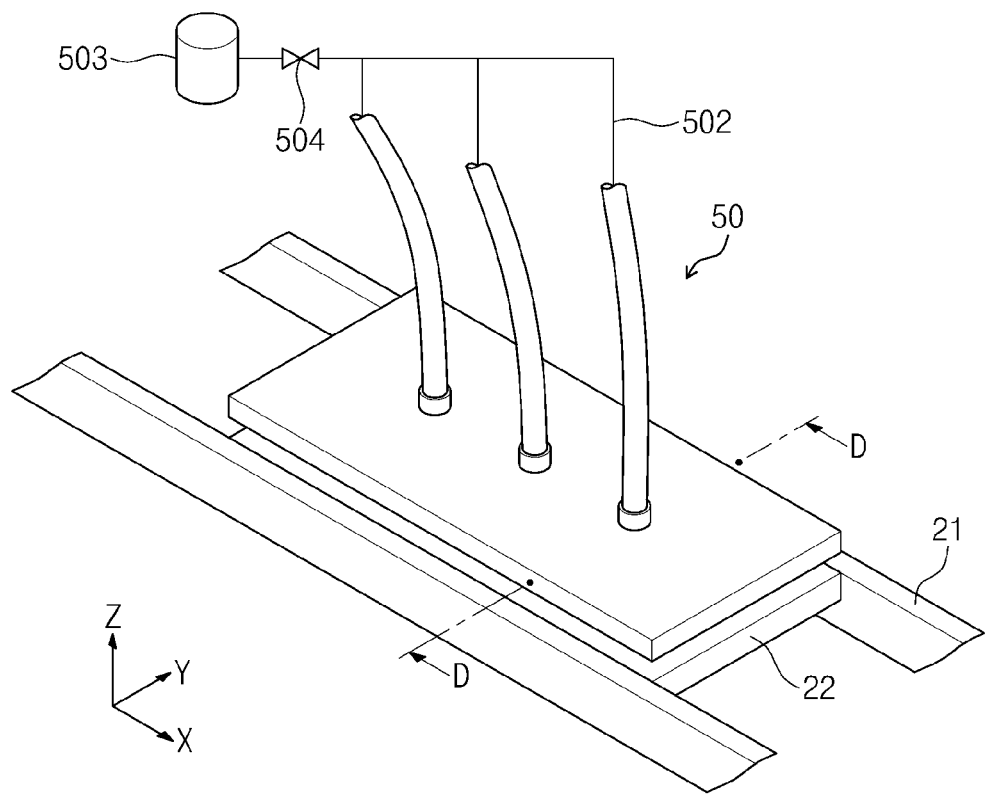
FIG. 10 is a perspective view illustrating an auxiliary bonding member of FIG. 1.

FIG. 10 is a perspective view illustrating an auxiliary bonding member of FIG. 1.

Referring to FIGS. 1 and 10, the auxiliary bonding member 50 may be disposed on a moving path of the shuttle 22. The auxiliary bonding member 50 pressurizes the die D bonded to the substrate S to improve a bonded degree with respect to the substrate S. The auxiliary bonding member 50 may be spaced by a desired (or alternatively, predetermined) distance from a top surface of the rail 21. The auxiliary bonding member 50 may have a size that corresponds to an area of the substrate S or an area of the shuttle 22.

Figure 11:
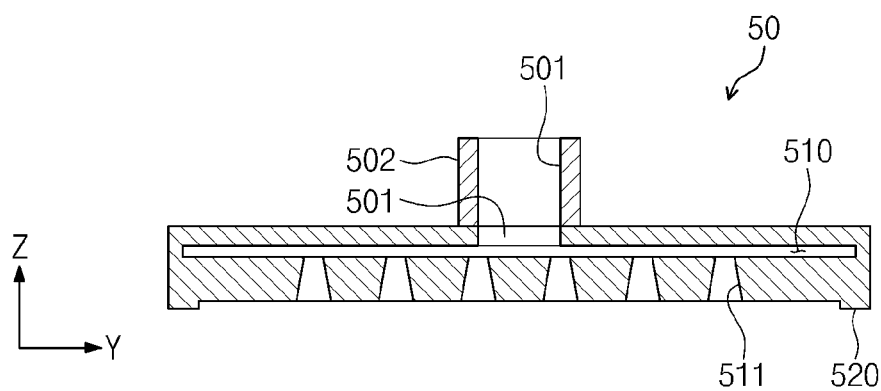
FIG. 11 is a cross-sectional view taken along line D-D of FIG. 10.

FIG. 11 is a cross-sectional view taken along line D-D of FIG. 10.

Referring to FIGS. 10 and 11, the auxiliary bonding member 50 may be connected to at least one pressurizing gas supply tube 502.

A supply hole 501 may be defined in the auxiliary bonding member 50 may include a supply hole 501 and a distribution space 510 connected to the supply hole 501. For example, the supply hole 501 may downwardly extends from the top. Further, the supply hole 501 may be defined to extend outward from a side surface of the auxiliary bonding member 50. The supply hole 501 may be connected to a pressurizing gas supply tube 502. The pressurizing gas supply tube 502 may be connected to the gas supply member 503 to supply the gas for pressurizing the die D to the auxiliary bonding member 50. The gas supply member 503 may be a gas supply member 223 to which a main pressurizing tube 221 is connected. Further, the gas supply member 503 may be separately provided in addition to the gas supply member 223 to which the main pressurizing tube 221 is connected. A valve 504 may be provided in the pressurizing gas supply tube 502 to open or close gas supply to the pressurizing gas supply tube 502 or to adjust an opened degree of the pressurizing gas supply tube 502. When the auxiliary bonding member 50 is connected to the plurality of pressurizing gas supply tubes 502, the supply holes 501 may have the same number as that of the pressurizing gas supply tubes 502.

The distribution space 510 is defined in the auxiliary bonding member 50. The distribution space 510 may provide a path through which the gas supplied to the supply hole 501 is distributed into each of pressurizing holes 511. For example, the distribution space 230 may have a plane shape having a desired (or alternatively, predetermined) thickness in the third direction Z and parallel to the ground or a top surface of the shuttle 22. Further, the distribution space 230 may have the form of lattices defining a plurality of spaces which are configured to communicate with each other.

Figure 12:
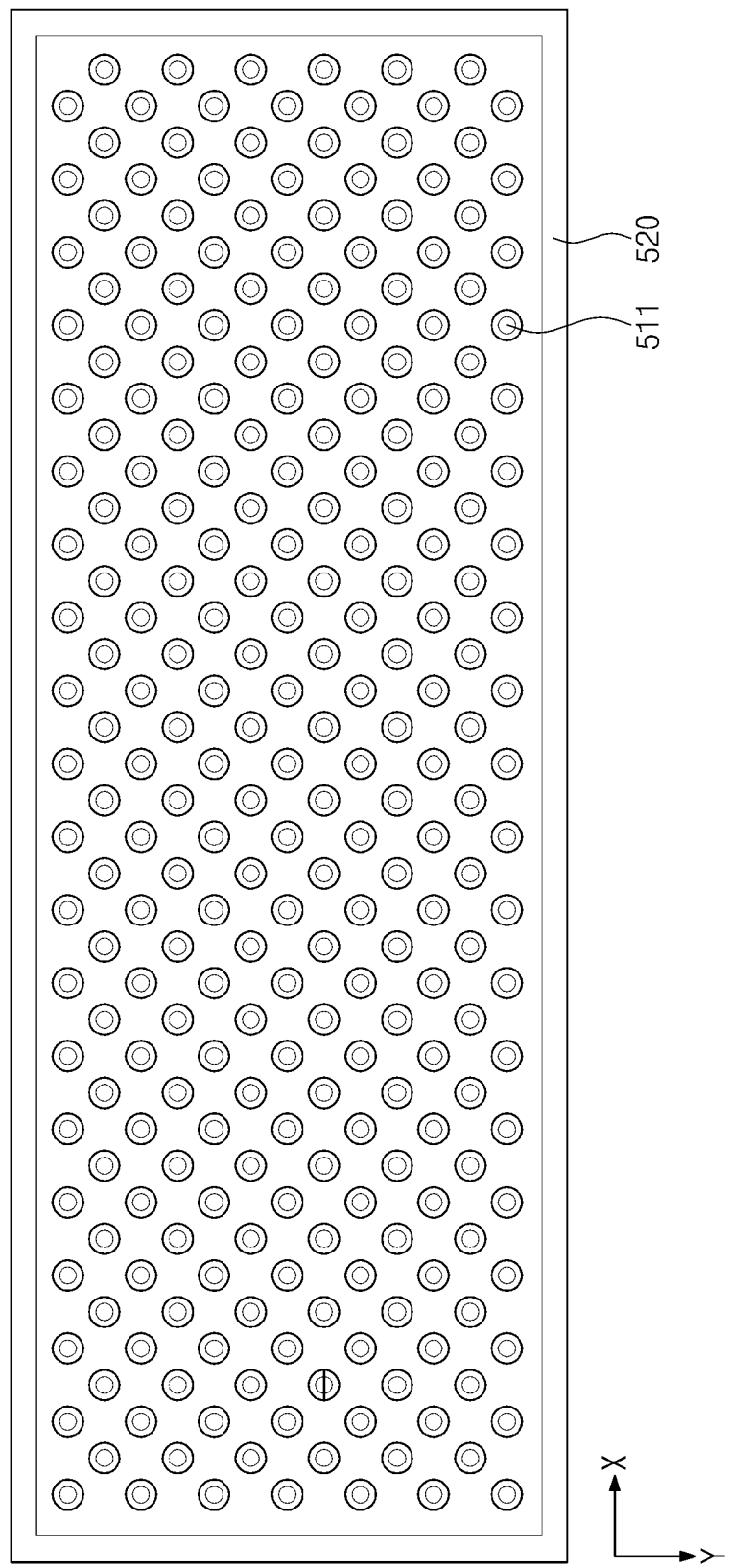
FIG. 12 is a bottom view of the auxiliary bonding member illustrated in FIG. 10.

FIG. 12 is a bottom view of the auxiliary bonding member illustrated in FIG. 10.

Referring to FIGS. 10 to 12, the pressurizing holes 511 are defined in the auxiliary bonding member 50.

The pressurizing holes 511 allow the distribution space 230 to communicate with a bottom surface of the auxiliary bonding member 50. The pressurizing holes 511 may have one ends uniformly located on the bottom surface of the auxiliary bonding member 50. A protrusion part 520 may be formed on the bottom surface of the auxiliary bonding member 50. The protrusion part 520 may be disposed at an outer portion of the bottom surface of the auxiliary bonding member 50, which surrounds the pressurizing holes 511. For example, the protrusion part 520 may be defined along an outermost edge of the bottom surface of the auxiliary bonding member 50.

Figure 13:
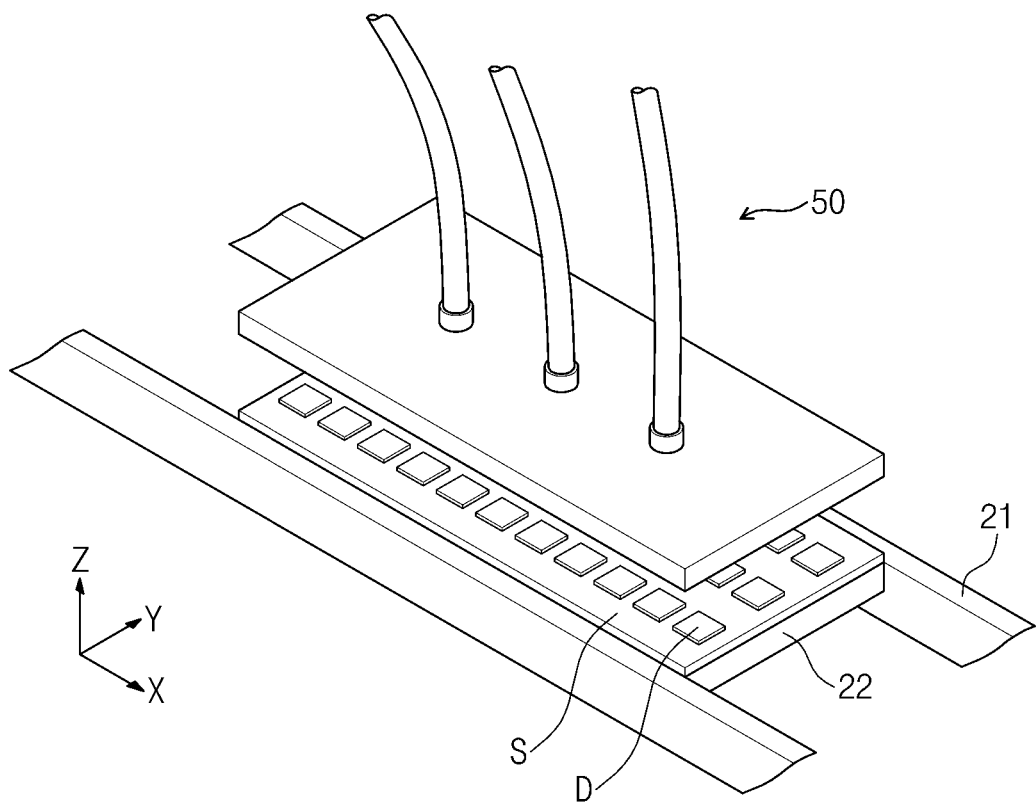
FIG. 13 is a view of a state where a shuttle is located under the auxiliary bonding member.
Figure 14:
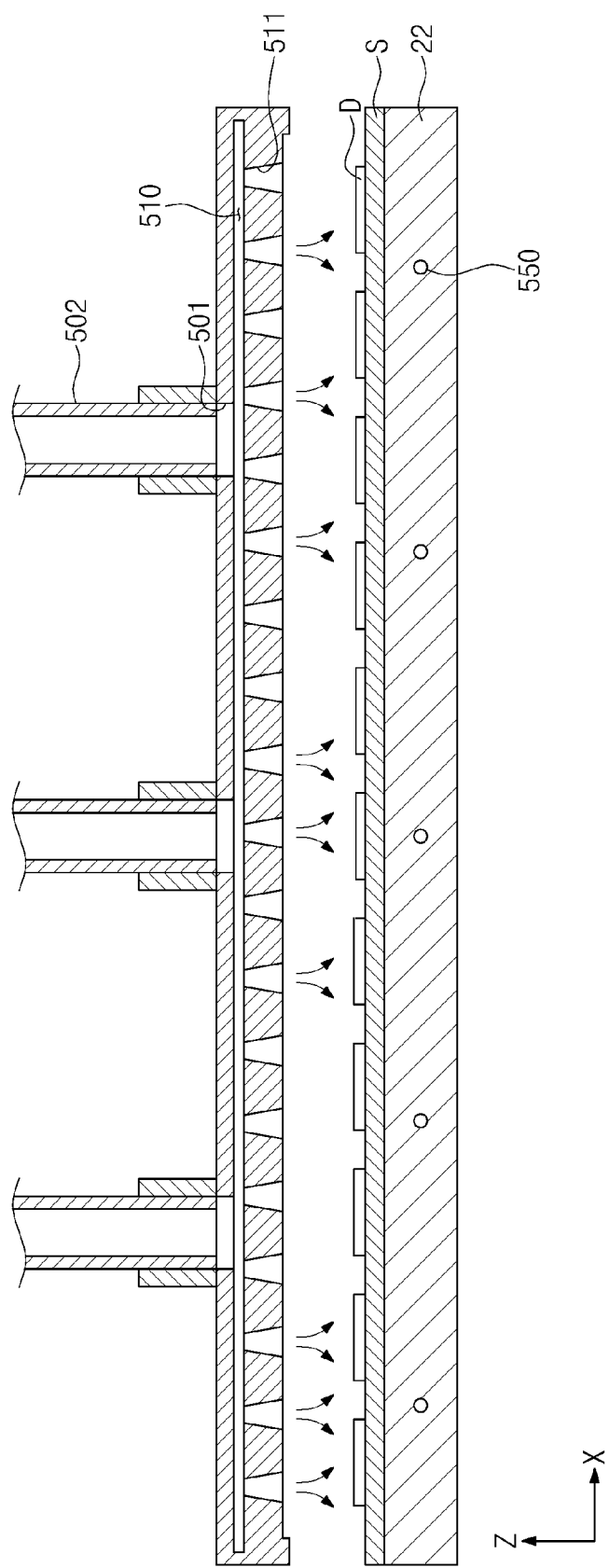
FIG. 14 is a side cross-sectional view of FIG. 13.

FIG. 13 is a view of a state where a shuttle is located under the auxiliary bonding member, and FIG. 14 is a side cross-sectional view of FIG. 13.

Referring to FIGS. 13 and 14, the dies D bonded to the substrate S may be pressurized by the auxiliary bonding member 50.

The substrate S to which the dies D are bonded by the bonding member 43 may be transferred toward the unloading member 30 by the shuttle 22. The substrate S may pass through under the auxiliary bonding member 50 in a transferring process. Here, the auxiliary bonding member 50 may supply the gas to a top surface of the substrate S at a desired (or alternatively, predetermined) pressure. The gas supplied to the top surface of the substrate S may further pressurize the dies D toward the substrate S. Thus, the bonding between the dies D and the substrate S may be further strengthened. Here, the protrusion part 520 mitigates or prevents the gas sprayed from the pressurizing hole 511 from leaking outside the auxiliary bonding member 50. Thus, by performing additional pressurization using the auxiliary bonding member 50 (e.g., adjusting the pressure applied by the auxiliary bonding member 50), the die D may be further bonded to the substrate S. Further, a heater 550 may be provided on the shuttle 22 to increase the bonding performance of the die D.

Figure 15:
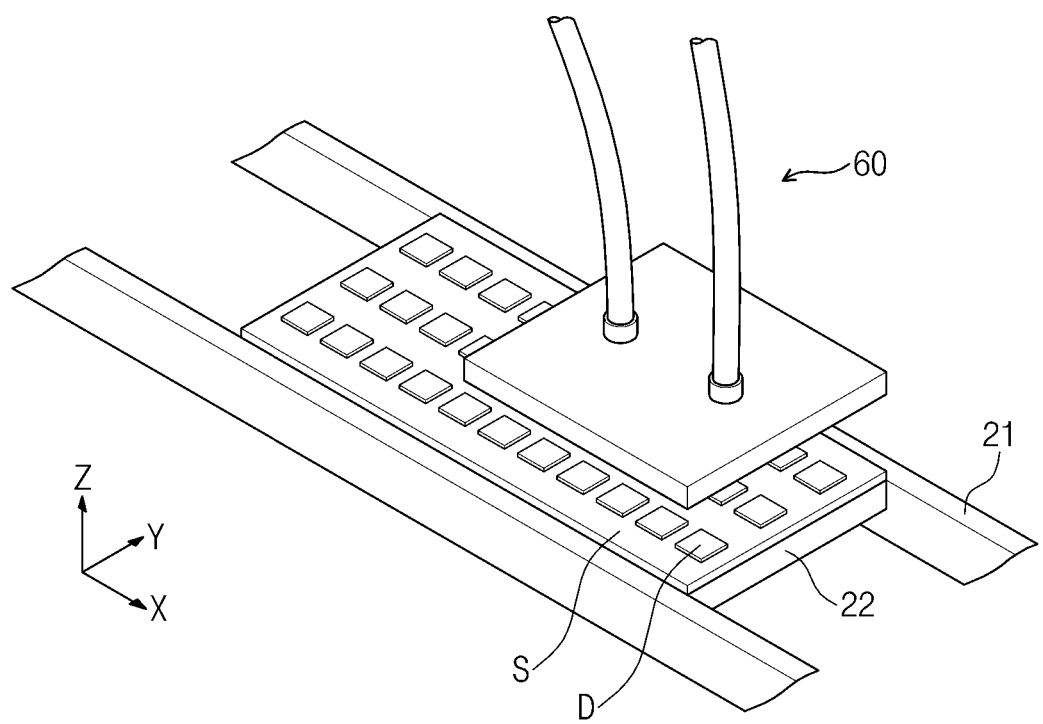
FIG. 15 is a perspective view of an auxiliary bonding member according to another example embodiment.

FIG. 15 is a perspective view of an auxiliary bonding member according to another example embodiment.

Referring to FIG. 15, an auxiliary bonding member 60 may have an area less than that of the substrate S or the shuttle 22. For example, the auxiliary bonding member 60 may have a bottom surface having a width in the second direction Y, which corresponds to a length of the substrate S in the second direction Y or a length of the shuttle 22 in the second direction Y. Further, the auxiliary bonding member 60 may have a bottom surface having a width in the first direction X, which is less than a length of the substrate S in the first direction X or a length of the shuttle 22 in the first direction X. The auxiliary bonding member 60 may spray a gas to the shuttle 22 traveling along the rail 21 to pressurize the die D.

According to some example embodiments, the distribution space 230 defined between the main pressurizing tube 221 and the branch tubes 222 may be omitted. Thus, the branch tubes 222 may be directly branched from the main pressurizing tube 221. For example, the branch tubes 222 may cross the inside of the bonding head 200 and the body 100 and be connected to the main pressurizing tube 221. For example, the main pressurizing tube 221 crosses the inside of the bonding head 200 and the body 100 to be connected to the branch tubes 222. For example, the main pressurizing tube 221 and the branch tubes 222 may respectively cross the inside of the bonding head 200 and the body 100 such that the main pressurizing tube 221 is connected to the branch tubes 222 in the bonding head 200 or the body 100.

According to some example embodiments of the inventive concepts, the auxiliary bonding member may be omitted.

According to some example embodiment of the inventive concepts, the heater 550 provided in the shuttle 22 may be omitted.

According to example embodiments of the inventive concept, damage while bonding the die to the substrate may be mitigated or prevented.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts are to be determined by the broadest permissible interpretation of the following claims and their equivalents, and shall not be restricted or limited by the foregoing detailed description.

What is claimed is:

1. A die bonding apparatus comprising:
   a transferring unit;
   a loading member configured to load a substrate to the transferring unit;
   an unloading member configured to unload the substrate from the transferring unit;
   a wafer holder configured to support a wafer providing dies; and
   a bonding member configured to pick up one of the dies from the wafer and configured to bond the picked-up die to the substrate loaded on the transferring unit by pressuring the picked-up die against the loaded substrate using a gas, wherein the bonding member includes,
      a body,
      a bonding head coupled to and disposed under the body, the bonding head having an adsorption hole configured to pick the die using a suction pressure and outer pressurizing grooves outside the adsorption hole, the outer pressurizing grooves providing a space, in which the gas pressurizing the picked-up die is received, and
      a pressurizing tube connected to a gas supply member and configured to supply the gas to the outer pressurizing grooves.

2. The die bonding apparatus of claim 1, wherein the pressurizing tube comprises:
   a main pressurizing tube connected to the gas supply member; and
   branch tubes branching from the main pressurizing tube, the branch tubes being connected to the outer pressurizing grooves, respectively.

3. The die bonding apparatus of claim 1, wherein a distribution space defined between the main pressurizing tube and branch tubes and configured to distribute the gas supplied from the main pressurizing tube to the branch tubes is defined in at least one of the body and the bonding head.

4. The die bonding apparatus of claim 3, wherein the distribution space comprises:
a main distribution space connected to the main pressurizing tube, the main distribution space having a ring shape; and
branch spaces defined in the bonding head and connected to the main distribution space, the branch spaces extending toward an outside of the bonding head in a lower portion of the main distribution space.

5. The die bonding apparatus of claim 4, wherein the branch spaces comprises:
first branch spaces at both sides of the main distribution space, each of the first branch spaces having a rod shape; and
second branch spaces at both sides of the main distribution space, each of the second branch spaces inclined with respect to a length direction of the first branch space.

6. The die bonding apparatus of claim 1, wherein the outer pressurizing grooves have a linear shape and are spaced a distance from each other in parallel.

7. The die bonding apparatus of claim 6, wherein side surfaces of the pressurizing grooves have symmetrical shapes with respect to a center axis of the bonding head.

8. The die bonding apparatus of claim 1, further comprising:
an inner pressurizing groove between the adsorption hole and the outer pressurizing grooves at a bottom surface of the bonding head, the inner pressurizing groove having a uniform width in each direction with respect to a center of the adsorption hole, the inner pressurizing groove providing a space in which the gas is received.

9. The die bonding apparatus of claim 1, further comprising:
an adsorption part protruding from a center of a bottom surface of the bonding head.

10. The die bonding apparatus of claim 9, wherein
the adsorption part surrounds the adsorption hole, and
the die bonding apparatus further includes,
an adsorption tube connected to the adsorption hole and defined at least one of inside the bonding head and inside the body, and
an intake member connected to the adsorption tube and configured to exhaust gas in the adsorption tube.

11. The die bonding apparatus of claim 10, further comprising:
a purge gas supply member connected to the adsorption tube and configured to supply a purge gas to the adsorption tube.

12. The die bonding apparatus of claim 1, wherein the transferring unit comprises:
rails between the loading member and the unloading member; and
a shuttle configured to travel along the rails and support the substrate,
wherein the die bonding apparatus further includes an auxiliary bonding member on a path through which the shuttle travels, the auxiliary bonding member configured to pressurize the die bonded to the substrate located on the shuttle.

13. The die bonding apparatus of claim 12, wherein the auxiliary bonding member configured to further pressurize the bonded die against the loaded substrate using a gas.

14. The die bonding apparatus of claim 13, wherein a bottom surface of the auxiliary bonding member has an area which corresponds to one of an area of the substrate and an area of the shuttle or has an area less than that of one of the substrate and the shuttle.

15. A die bonding apparatus comprising:
a die bonding member including,
a body; and
a bonding head connected to and disposed under the body and configured to pressurize a die against a substrate such that the die is bonded to the substrate, the bonding head including,
a first pressurizing portion configured to pressurize a first portion of the die against the substrate mechanically, the first pressurizing portion housing an adsorption hole and configured to pick the die using a suction pressure,
a second pressurizing portion configured to pressurize a second portion of the die against the substrate based on a gas-based pressure, the second pressurizing portion including outer pressurizing grooves outside the adsorption hole, the outer pressurizing grooves providing a space, in which a gas for pressurizing the picked-up die is received, and
a pressurizing tube connected to a gas supply member and configured to supply the gas to the outer pressurizing grooves.

16. The die bonding apparatus of claim 15, wherein the first pressurizing portion is a protrusion at a bottom surface of the bonding head.

17. The die bonding apparatus of claim 16, wherein the outer pressurizing grooves surround the protrusion.

18. The die bonding apparatus of claim 15, wherein when pressurizing the die, a lowermost point of the first pressurizing portion is configured to be in a closer proximity to the die than a lowermost point of the second pressurizing portion.

19. The die bonding apparatus of claim 15, wherein the first pressurizing portion downwardly protrudes further than the second pressurizing portion.

20. A die bonding apparatus comprising:
a transferring unit;
a loading member configured to load a substrate to the transferring unit;
an unloading member configured to unload the substrate from the transferring unit;
a wafer holder configured to support a wafer providing dies; and
a bonding member configured to pick up one of the dies from the wafer and configured to bond the picked-up die to the substrate loaded on the transferring unit by pressuring the picked-up die against the loaded substrate using a gas,
wherein the bonding member includes,
a body, and
a bonding head coupled to and disposed under the body, the bonding head having an adsorption hole configured to pick the die using a suction pressure and branch tubes spaced apart from the adsorption hole, the branch tubes configured to supply the gas to the picked-up die.

* * * * *